United States Patent
Usugi et al.

(10) Patent No.: US 8,456,205 B2
(45) Date of Patent: Jun. 4, 2013

(54) PHASE-FREQUENCY COMPARATOR AND SERIAL TRANSMISSION DEVICE

(75) Inventors: Tatsunori Usugi, Hamura (JP); Takeshi Isezaki, Ome (JP); Takeshi Koyama, Ome (JP)

(73) Assignee: Hitachi, Ltd., Tokyo (JP)

( * ) Notice: Subject to any disclaimer, the term of this patent is extended or adjusted under 35 U.S.C. 154(b) by 152 days.

(21) Appl. No.: 12/987,108

(22) Filed: Jan. 8, 2011

(65) Prior Publication Data
US 2011/0175648 A1 Jul. 21, 2011

(30) Foreign Application Priority Data
Jan. 18, 2010 (JP) .................... 2010-007693

(51) Int. Cl.
*H03L 7/06* (2006.01)
(52) U.S. Cl.
USPC ............ 327/156; 327/145; 327/147; 327/157
(58) Field of Classification Search
USPC .............. 327/141, 144–163; 331/1 A, 15–17; 375/373–376
See application file for complete search history.

(56) References Cited

U.S. PATENT DOCUMENTS

| | | | | |
|---|---|---|---|---|
| 6,437,616 B1* | 8/2002 | Antone et al. | ................ | 327/158 |
| 6,931,086 B2* | 8/2005 | Harrison | ........................ | 375/374 |
| 7,605,623 B2* | 10/2009 | Yun et al. | ....................... | 327/158 |
| 8,023,606 B2* | 9/2011 | Ozawa | ........................... | 375/355 |
| 2004/0212412 A1* | 10/2004 | Saeki | ............................ | 327/156 |
| 2005/0189974 A1* | 9/2005 | Chao | ............................ | 327/158 |
| 2009/0045858 A1* | 2/2009 | Hur | ................................ | 327/158 |
| 2009/0262876 A1* | 10/2009 | Arima et al. | .................. | 375/374 |
| 2011/0012654 A1* | 1/2011 | Shin et al. | .................... | 327/158 |
| 2011/0074479 A1* | 3/2011 | Yun et al. | ..................... | 327/158 |

FOREIGN PATENT DOCUMENTS

JP 2004-357076 A 12/2004

* cited by examiner

*Primary Examiner* — Lincoln Donovan
*Assistant Examiner* — Brandon S Cole
(74) *Attorney, Agent, or Firm* — Miles & Stockbridge P.C.

(57) ABSTRACT

Disclosed is a phase-frequency comparator stabilizing a loop band width by a simple circuit, there is provided a phase-frequency comparator which is a phase-frequency comparator of inputting a reference clock and a feedback clock and outputting an up signal to a frequency synthesizer and a down signal to the frequency synthesizer, which is provided with a first phase-frequency comparing circuit, a second phase comparing circuit, and a delay circuit portion inputting the reference clock and the feedback clock and providing a predetermined relative delay to an input of the first phase-frequency comparing circuit and an input of the second phase comparing circuit, in which frequency comparison is carried out by the first phase-frequency comparing circuit, and phase comparison is carried out by the first phase-frequency comparing circuit and the second phase comparing circuit controlling a latch.

12 Claims, 13 Drawing Sheets

PHASE-FREQUENCY COMPARATOR AND SERIAL TRANSMISSION DEVICE

CLAIM OF PRIORITY

The present application claims priority from Japanese patent application JP 2010-007693 filed on Jan. 18, 2010, the content of which is hereby incorporated by reference into this application.

FIELD OF THE INVENTION

The present invention relates to a phase-frequency comparator and a serial transmission device.

BACKGROUND OF THE INVENTION

A phase synchronizing circuit (PLL) frequency synthesizer is widely used in generating a clock on a side of receiving serial transmission, generating a clock of a semiconductor integrated circuit or the like. In PLL, a phase comparator is used for adjusting phases between a feedback clock and a reference clock. The phase comparator compares the phases of the feedback clock and the reference clock, and outputs up/down signals in accordance with a delay or an advance in the phases therebetween.

The phase comparator is provided with a mechanism of outputting a short up signal and a short down signal even when a phase difference between the feedback clock and the reference clock is small in order to prevent a dead zone. JP-A-2004-357076 shows a phase comparator of comparing a phase of a first input signal and a phase of a second input signal, which is a phase comparator having a first delay circuit of outputting a first delay signal by delaying a first input signal, a second delay circuit of outputting a second delay signal by delaying a second input signal, a first phase comparing circuit which is inputted with the first input signal and the second delay signal, and in which when a phase of the first input signal is more advanced than a phase of the second delay signal, a first output pulse in correspondence with the advance is outputted, and a second phase comparing circuit which is inputted with the second input signal and the first delay signal, and in which when a phase of the second input signal is more advanced than a phase of the first delay signal, a second output pulse in correspondence with the advance is outputted, showing a phase comparator which can prevent generation of a dead zone by outputting a minimum pulse even when the phases coincide with each other by a simple constitution.

SUMMARY OF THE INVENTION

FIG. 2 shows a block diagram of a frequency synthesizer which has been investigated prior to the present application. A frequency synthesizer 201 is provided with a phase-frequency comparator (PFC) 202, a booster circuit (CP) 203, a low pass filter (LPF) 204, a voltage control oscillator (VCO) 205, and a divider (DI) 206. FIG. 3 shows an example of a constitution of a circuit of the phase-frequency comparator 202. The phase frequency comparator 202 includes latches 301 and 302 for maintaining "H" level with regard to inputs of phase edges of a reference clock (Reference Clock) and a feedback clock (Feedback Clock), and is constituted by an AND circuit 303 of resetting the both latches when the both latches become "H" level, and outputs of the latches 301 and 302 respectively become an up signal (UP) and a down signal (DOWN).

First, an explanation will be given of an operation of the investigated circuit. FIG. 4 shows an operation timing. In a case 401 where a frequency of the reference clock is higher than that of the feedback clock, an "H" level is outputted by a side of the up signal for a time period longer than that of a side of the down signal, and in a case 402 where the frequency of the reference clock is lower than that of the feedback clock, the "H" level is outputted by the side of the down signal for a time period longer than that of the side of the up signal. In a case where the frequencies of the reference clock and the feedback clock are substantially equal to each other, and a case 403 where the phase of the feedback clock is more delayed than that of the reference clock, and also a case 404 where the phase of the feedback clock is more advanced than that of the reference clock, pulses are respectively outputted by output patterns shown below. In the output patterns of a result of comparing the phases, in accordance with initial values of the latches 301 and 302, there are respectively present 2 ways of the output patterns of a pattern 403A and a pattern 403B in the case 403, and a pattern 404A and a pattern 404B in the case 404. These are outputs in proportion to the phase differences including signs, and the differences of whether the phases are advanced to be locked or whether the phases are delayed to be locked for the frequency synthesizer. Therefore, in each of the cases, either of the 2 ways of the patterns is outputted.

The booster circuit 203 injects a constant current to the low pass filter 204 during a time period in which the pulse on the side of the up signal is being erected, and pulls out the constant current during a time period in which the pulse on the side of the down signal is being erected. The low pass filter 204 outputs a voltage in accordance with an electric charge accumulated by the booster circuit 203. The voltage control oscillator 205 outputs a clock of the frequency in accordance with the inputted voltage, and the divider 206 feeds back a feedback clock of a period multiplied by a dividing ratio of the clock outputted by the voltage control oscillator 205 to an input of the phase-frequency comparator 202. The series of operations are repeated until the frequencies and the phases of the reference clock and the feedback clock substantially coincide with each other, and a steady state is established by a state in which the clock having the frequency multiplied by the dividing ratio in which the phase of the clock substantially coincides with that of the reference clock is outputted from the voltage control oscillator 205.

Next, an explanation will be given of a problem of the circuit which has been found as a result of carrying out the investigation by the inventors of the present application. FIG. 5 shows a relationship between the phase difference between the reference clock and the feedback clock of the phase-frequency comparator 202 and the output signal. The ordinate designates a difference between an up signal pulse width and a down signal pulse width, and the abscissa designates a phase difference of the feedback clock relative to the reference clock. Although a linear characteristic given by a dotted line is ideal from a way of thinking of a linear system, in a real circuit, a characteristic as shown by a bold line is constituted owing to an element characteristic and a parasitic element, and a dead zone which cannot detect the phase difference is brought about when the phase difference is small. Further, a dispersion of the parasitic element in fabrication is considerable, and therefore, also a width of the dead zone is considerably dispersed.

As a phase comparator of preventing generation of a dead zone, there is a technology disclosed in JP-A-2004-357076 showing a circuit diagram thereof in FIG. 6. A phase comparing circuit 602 to which a reference clock is inputted by being delayed by a delay element 601 and a phase comparing circuit 604 to which a feedback clock is inputted by being delayed by a delay element 603 are connected in parallel, and a down signal of the phase comparing circuit 602 and an up signal of the phase comparing circuit 604 are used as outputs. As shown by a timing chart in FIG. 7, although in a timing chart 701 before improvement, both of the up signal and the down signal are not outputted owing to the dead zone, in a timing chart 702 after improvement, the dead zone is avoided by changing up and down sensitivities by delay, and even when the phase difference is small, also the pulse of either of the up signal and the down signal is outputted at minimum. FIG. 8 shows a relationship between a difference of a pulse width of the up signal and a pulse width of the down signal and the phase difference. As shown by FIG. 8, an output characteristic preventing generation of the dead zone is constituted.

However, in the relationship between the difference of the pulse width of the up signal and the pulse width of the down signal and the phase difference, the relationship between the difference of the pulse width of the up signal and the pulse width of the down signal and the phase difference behaves to have different inclinations in a range having a small phase difference and a range having a large phase difference, and the relationship becomes nonlinear when the relationship is observed in a wide range. Further, at a region at which the inclination is changed, the characteristic is particularly dispersed since the region is considerably influenced by the width of forming the dead zone shown in FIG. 5, that is, the influence of the dispersion in fabrication. The nonlinearity and the dispersion in the characteristic bring about a dispersion in a loop band width. The loop band width is a maximum value which can follow a speed of a fluctuation when the frequency of the reference clock is fluctuated. For example, although in a frequency synthesizer mounted to a high speed interface, the loop band width is prescribed strictly by a standard, the loop band width is significantly dependent on a characteristic of outputting the phase difference, and therefore, a problem of preventing the influence of the nonlinearity and the dispersion in fabrication is posed.

Hence, the inventors of the present application have conceived that a linear characteristic can be achieved in a wide phase difference range as shown by FIG. 9 without minimizing a pulse width shown in FIG. 7, that is, by increasing delay time by a delay element shown in FIG. 6. Further, the inventors have conceived to use a phase-frequency comparing circuit which can carry out a comparison of a frequency and a comparison of a phase by a simple circuit constitution in place of the phase comparing circuit 602 and the phase comparing circuit 604.

However, in the case of the phase-frequency comparing circuit, in a transition of an operation from the comparison of the frequency to the comparison of the phase, it is indefinite which value of "H" and "L" is taken by initial values of the latches 301 and 302 in the two phase-frequency comparing circuits. There are present a case in which a pair of phase edges respectively constituting objects of comparison in the two phase-frequency comparators coincide with each other, and a case in which a pair of different phase edges are compared in accordance with 2 ways of operations, which are shown by pattern 403A and pattern 403B, and pattern 404A and pattern 404B of FIG. 4. For example, when a feedback clock and a reference clock are inputted to two of input phase-frequency comparing circuits by delaying the feedback clock relative to the reference clock, a pair of phase edges which differ from each other are compared, and an output of the pattern 403A is constituted at the phase-frequency comparing circuit on one hand, however, there is also a case in which it is determined that the feedback clock is more advanced in the phase-frequency comparing circuit on the other hand, and an output of pattern 403B is constituted.

A characteristic shown in FIG. 9 is on the premise that the pair of phase edges respectively constituting the objects of comparison in two of the phase-frequency comparing circuits coincide with each other between the two phase-frequently comparing circuits. When the pair of phase edges do not coincide with each other, an up signal and a down signal do not become desired pulses as is known from a difference between the up signal and the down signal at pattern 403A and pattern 403B, that is, that up and down are inverse to each other, and pulse widths differ from each other, a characteristic which differs from the characteristic of FIG. 9 is constituted, a desired operation is not achieved, and an erroneous operation is carried out.

An example of a representative aspect of the present invention will be shown as follows.

There is provided a phase-frequency comparator which is a phase-frequency comparator which is inputted with a reference clock and a feedback clock and outputs an up signal to a frequency synthesizer and a down signal to the frequency synthesizer, in which the phase-frequency comparator is provided with a first phase-frequency comparing circuit, a second phase comparing circuit, and a delay circuit portion which is inputted with the reference clock and the feedback clock, and provides a predetermined relative delays to an input of the first phase-frequency comparing circuit and an input of the second phase comparing circuit, a comparison of a frequency is carried out in the first phase-frequency comparing circuit, and a comparison of a phase is carried out by the first phase-frequency comparing circuit and the second phase comparing circuit which controls a latch.

Thereby, a pair of phase edges respectively constituting objects of comparison between the first phase-frequency comparing circuit and the second phase comparing circuit coincide with each other.

Thereby, a phase-frequency comparator stabilizing a loop band width can be provided by a simple circuit.

DETAILED DESCRIPTION OF THE PREFERRED EMBODIMENTS

A detailed description will be given of the present invention in reference to embodiments as follows.

First Embodiment

Figure 1:
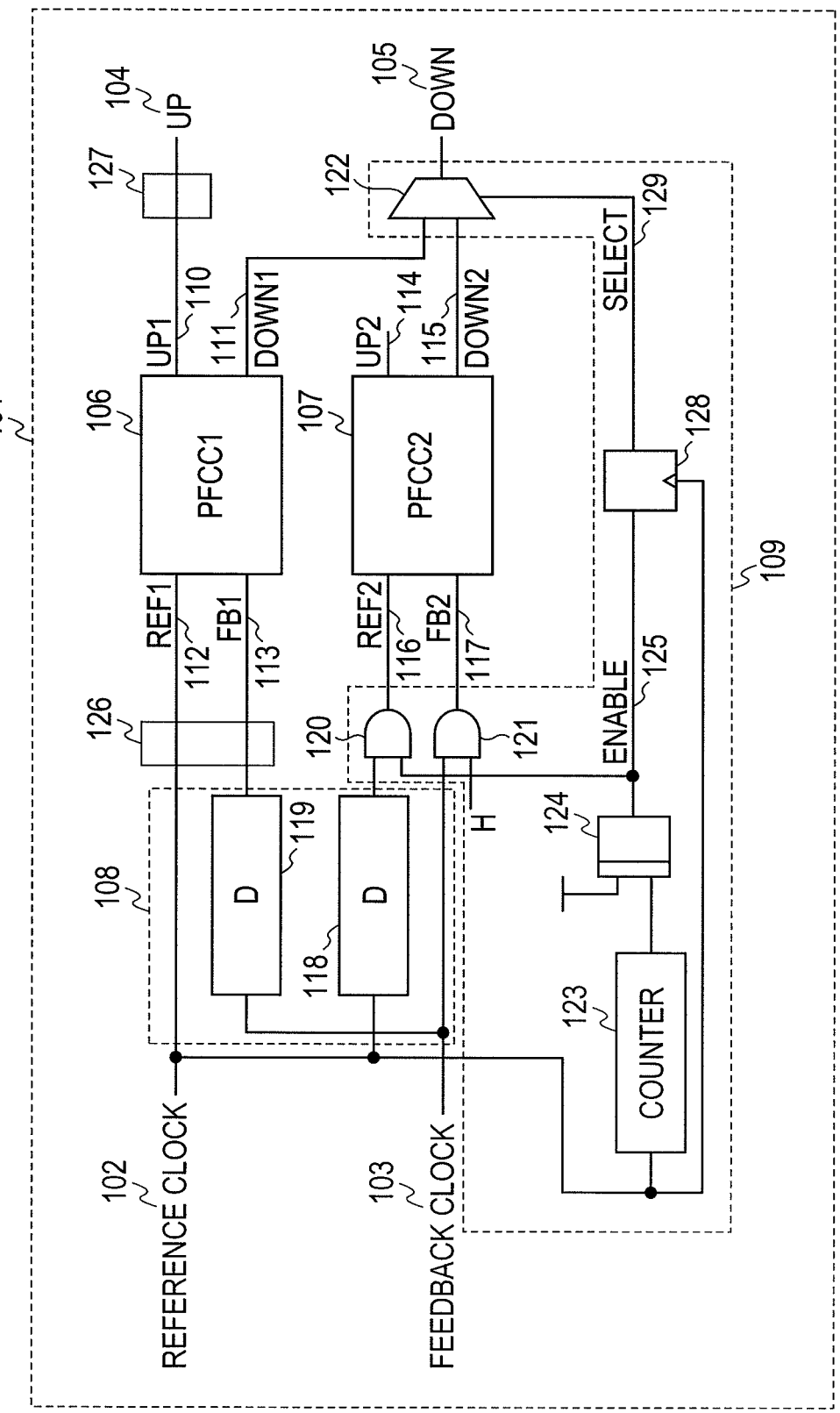
FIG. 1 is a block diagram showing an embodiment of a circuit constitution of a phase-frequency comparator according to the present invention.
Figure 2:
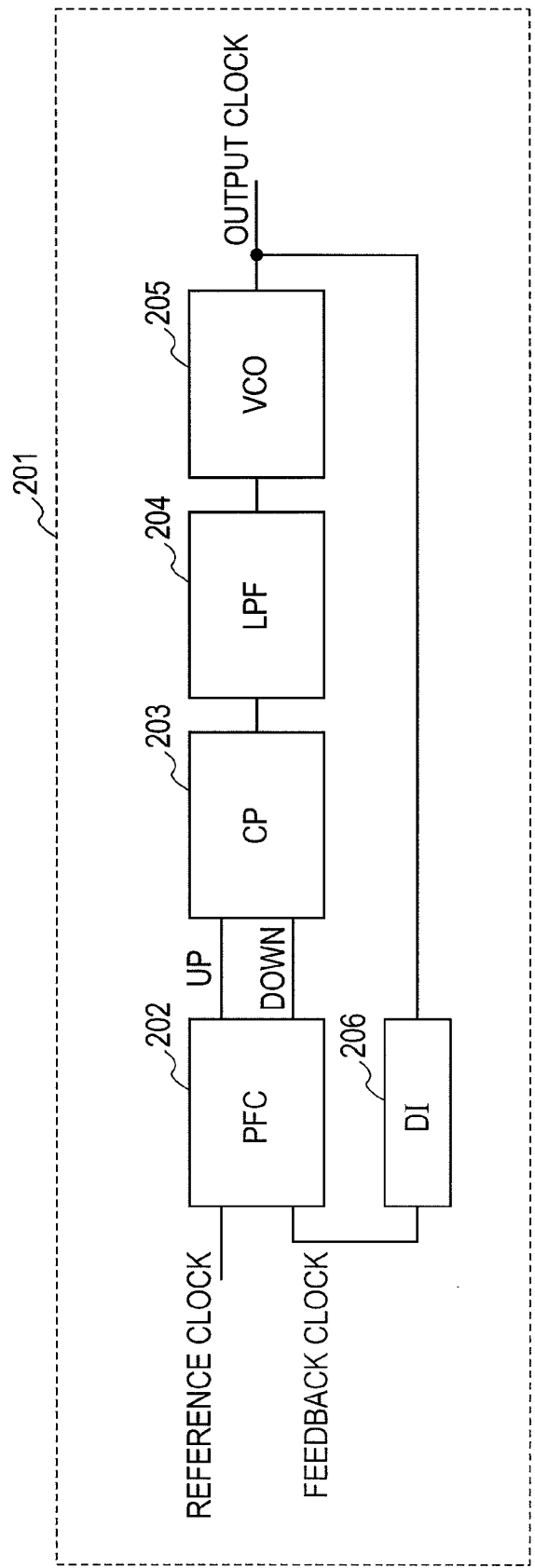
FIG. 2 is a block diagram showing a circuit constitution of a frequency synthesizer.

FIG. 1 is a block diagram of a phase-frequency comparator 101 according to the present invention. The phase-frequency comparator 101 shown in FIG. 1 inputs a reference clock 102 and a feedback clock 103, and outputs an up signal 104 and a down signal 105. A description will be given as follows of an example of applying the phase-frequency comparator 101 to the phase-frequency comparator 202 of the frequency synthesizer 201 of FIG. 2. That is, a description will be given of an example of using the up signal 104 as the up signal to the frequency synthesizer 201, and using the down signal 105 as the down signal to the frequency synthesizer 101. The phase-frequency comparator 101 is provided with a first phase-frequency comparing circuit 106, a second phase-frequency comparing circuit 107, a delay circuit portion 108, and a control circuit portion 109.

The first phase-frequency comparing circuit 106 inputs a first reference clock 112 and a first feedback clock 113, and outputs a first up signal 110 and a first down signal 111. The second phase-frequency comparing circuit 107 inputs a second reference clock 116 and a second feedback clock 117, and outputs a second up signal 114 and a second down signal 115. It is described in the present embodiment that although the output of the second up signal 114 is not needed, by making a characteristic of the first phase-frequency comparing circuit 106 and a characteristic of the second phase-frequency comparing circuit 107 as uniform as possible, promotion of a characteristic of a loop band width of the phase-frequency comparator 101 can easily be achieved, and therefore, the output of the second up signal 114 is also provided. Further, although the second phase-frequency comparing circuit may be a phase comparing circuit which does not carryout a comparison of a frequency, the second phase-frequency comparing circuit is constituted by the phase-frequency comparing circuit, since the promotion of a characteristic of the loop bandwidth of the phase-frequency comparator 101 can easily be achieved by making the characteristic of the first phase-frequency comparing circuit 106 and the characteristic of the second phase-frequency comparing circuit 107 as uniform as possible.

The delay circuit portion 108 inputs the reference clock 102 and the feedback clock 103 and outputs the reference clock 102 and the feedback clock 103 to an input of the first phase-frequency comparing circuit 106 and an input of the second phase-frequency comparing circuit 107 such that an amount of a delay of the reference clock 102 relative to the feedback clock 103 is relatively large in the input of the second phase-frequency comparing circuit 107 in comparison with in the input of the first phase-frequency comparing circuit 106. According to the embodiment, for that purpose, a delay element 118 is provided between the input of the reference clock 102 of the phase-frequency comparator 101 and the input of the reference clock 116 of the second phase-frequency comparing circuit 107, and a delay element 119 is provided between the input of the feedback clock 103 of the phase-frequency comparator 101 and the input of the feedback clock 113 of the phase-frequency comparing circuit 106. That is, with regard to the first phase-frequency comparing circuit 106, a signal constituted by delaying the feedback clock 103 by the delay element 119 is inputted, and with regard to the second phase-frequency comparator 107, a signal constituted by delaying the reference clock 102 by the delay element 118 is inputted.

According to the embodiment, an input path of the first phase-frequency comparator 106 and an input path of the second phase-frequency comparator 107 are respectively inserted with the delay circuit 118 and the delay circuit 119, thereby, steady-state phase error can be restrained from being generated by making the circuits symmetrical with each other. However, in a case of posing a problem only by a linearity of the output relative to the phase difference, either one of the delay circuit 118 and the delay circuit 119 may be inserted thereinto.

The control circuit portion 109 is provided with an AND circuit 120, an AND circuit 121, a selector 122, a counter 123, a latch 124, and a flip-flop 128. The AND circuit 120 inputs an output from the delay element 118 of the delay circuit portion 108 and an output of the latch 124, and an output thereof is connected to the input of the second reference clock 116 of the second phase-frequency comparator 107. The AND circuit 121 inputs the feedback clock 103 and a power source level, and an output thereof is connected to the input of the second feedback clock 117 of the second phase-frequency comparator 107. The selector 122 inputs a selecting signal 129, the first down signal, and the second down signal 115, and an output thereof is constituted by the down signal 105 of the phase-frequency comparator 101. The counter 123 counts a number of pulses of the reference clock, and outputs a signal to the latch 124 when a predetermined count number is reached. The latch 124 outputs an enable signal 125 to the AND circuit 120, and the flip-flop 128 after receiving a signal from the counter 123. The flip-flop 128 inputs the enable signal 125 and the reference clock 102, and outputs the selecting signal 129 to the selector 122 at a timing described later. A description will be given later of the predetermined count number. Further, a dummy delay element 126 and a dummy element 127 are inserted in order to adjust delay time by the AND circuit 120, the AND circuit 121, and the selector 122. Also the dummy delay element 126 and the dummy delay element 127 construct a constitution for restraining a steady-state phase error from being generated similar to a combination of the delay element 118 and the delay element 119, which is not needed in a case of posing a problem only by the linearity of the output relative to the phase difference. Further, the AND circuit 121 is arranged for facilitating to design the delay element circuit 108 by reducing an influence of a shift of a timing of an input of the second feedback clock 126 to the second phase-frequency comparing circuit 107 by the AND circuit 120 by arranging the AND circuit 121 in parallel with the AND circuit 120 as shown by FIG. 1. The AND circuit 121 is not necessarily needed, but the feedback clock 103 may be inputted as the second feedback clock 117 without interposing the AND circuit 121.

Figure 10:
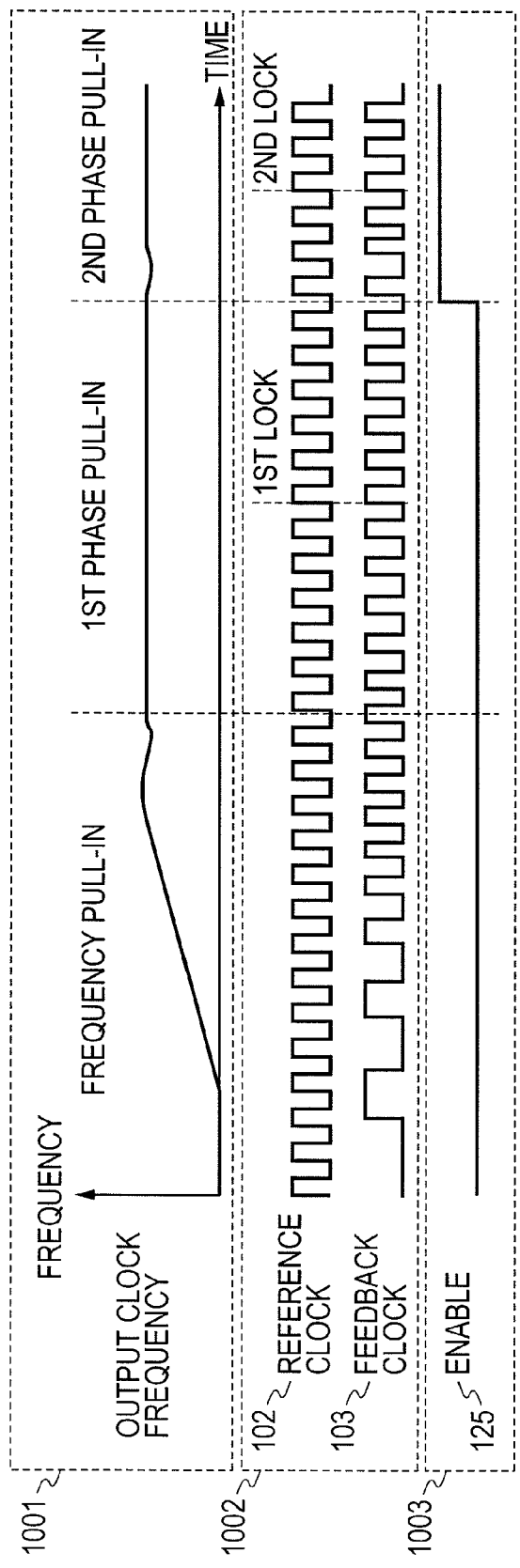
FIG. 10 is a timing chart showing a frequency and phase lock operation according to the present invention.

Next, an explanation will be given of an operation of the phase-frequency comparator 101. FIG. 10 shows a timing of an operation of a total of the frequency synthesizer connected with the phase-frequency comparator 101. An upper stage 1001 shows a change over time of a frequency of the output clock, a middle stage 1002 shows operations of the reference clock 102 and the feedback clock 103, and a lower stage 1003 shows a timing at which the control circuit 109 outputs the enable signal 125.

Figure 3:
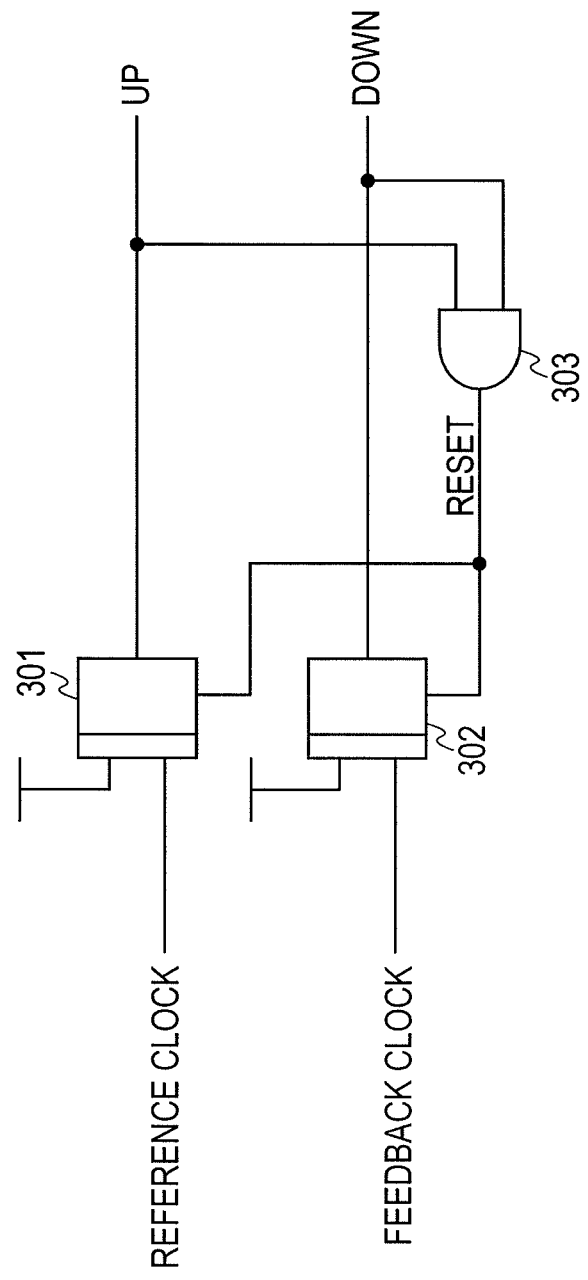
FIG. 3 is a block diagram showing a circuit constitution of a phase-frequency comparator.
Figure 4:
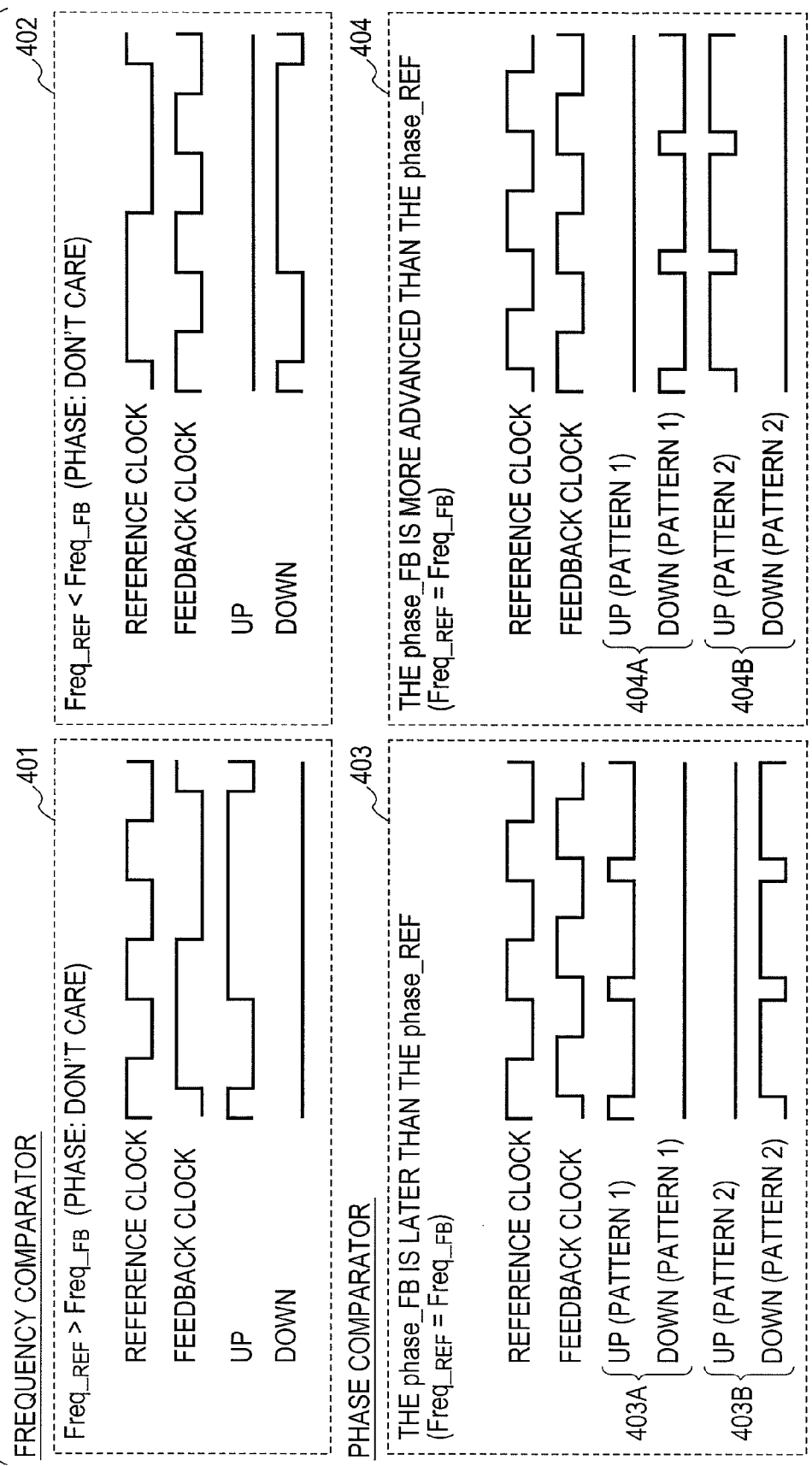
FIG. 4 is a timing chart showing an operation of the phase-frequency comparator.
Figure 5:
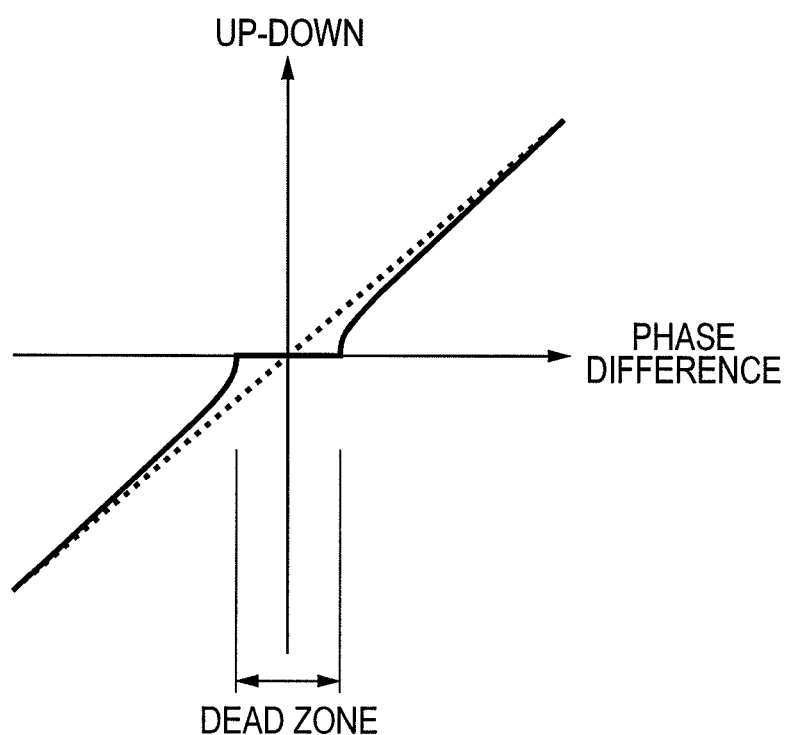
FIG. 5 is a diagram showing an output characteristic of the phase-frequency comparator.
Figure 6:
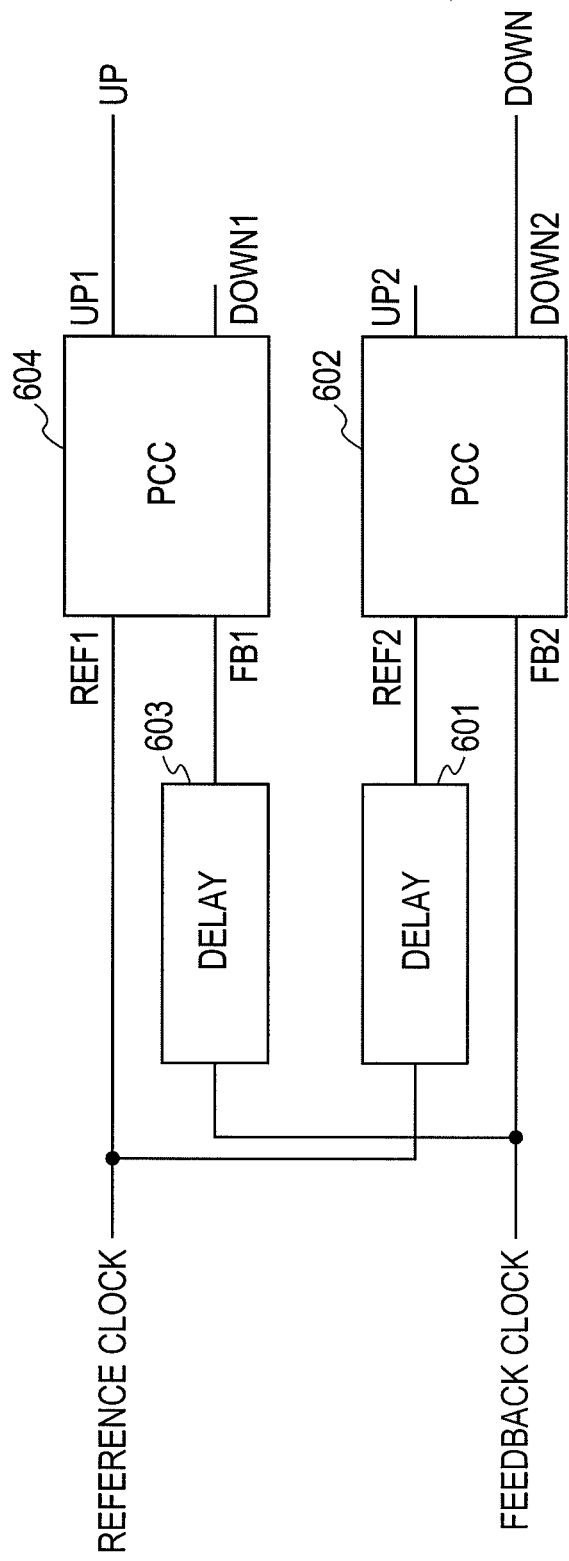
FIG. 6 is a block diagram showing a circuit constitution of a phase/comparator improving a dead zone.
Figure 7:
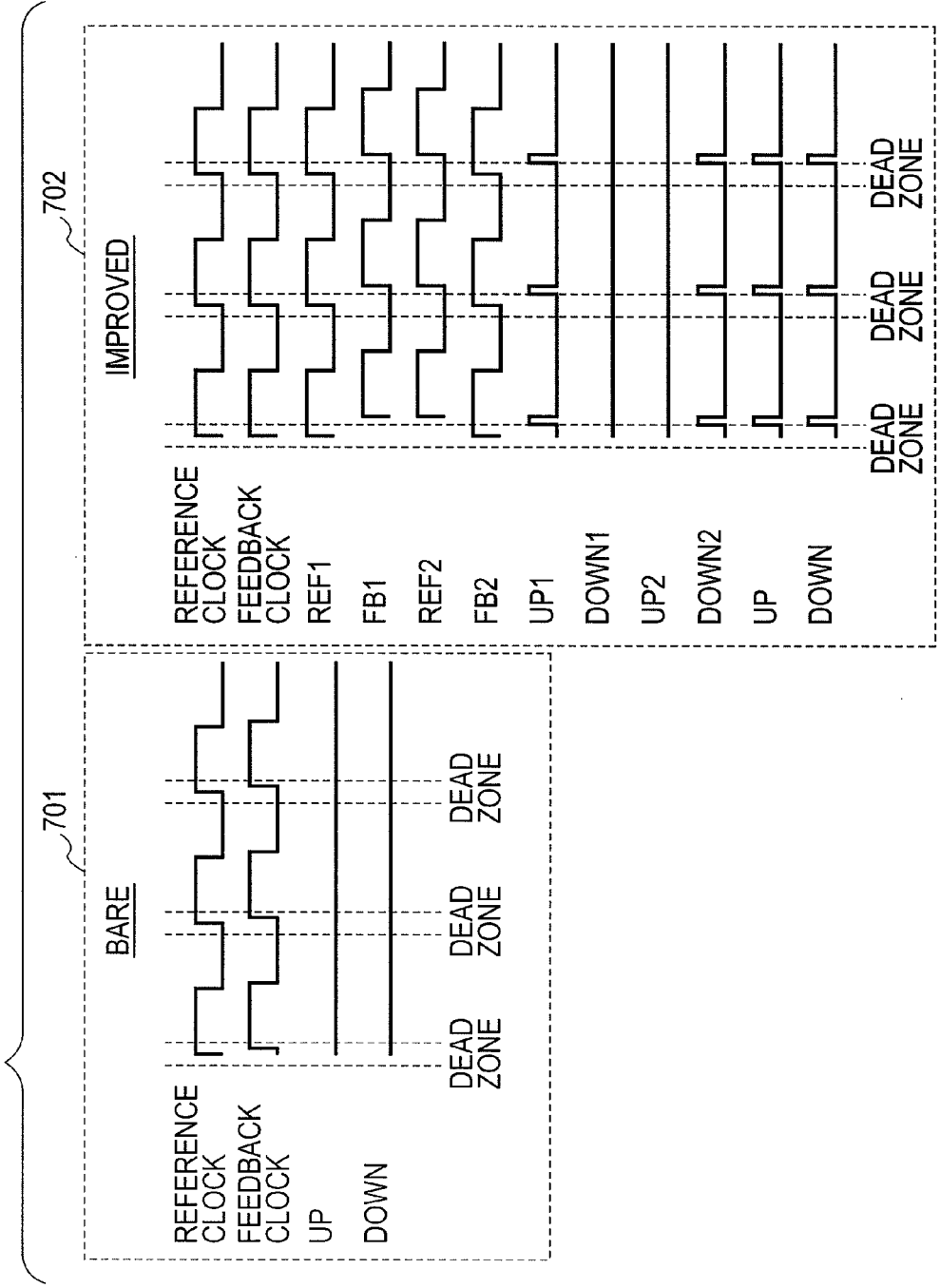
FIG. 7 is a timing chart showing an operation of the phase comparator improving the dead zone.
Figure 8:
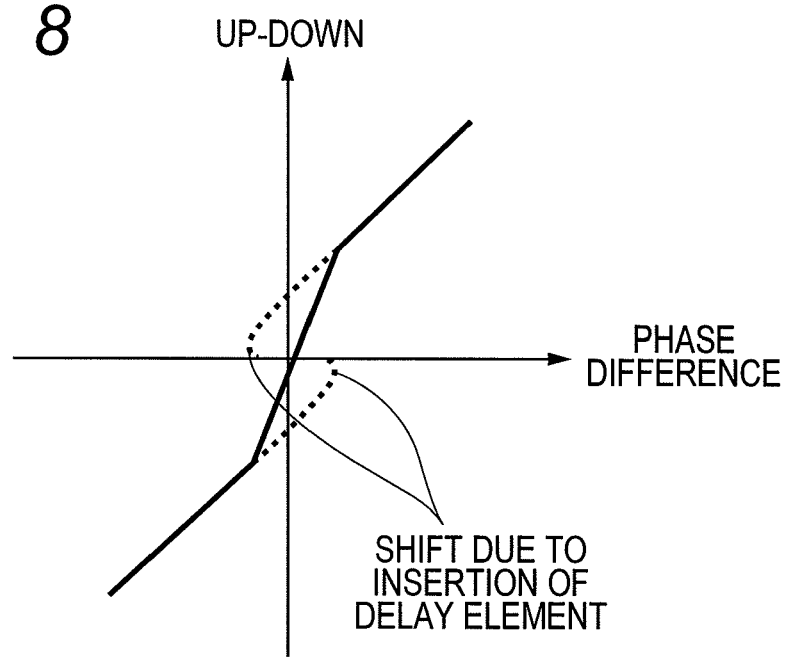
FIG. 8 is a diagram showing an output characteristic of the phase comparator improving the dead zone.

The first phase-frequency comparator 106 and the second phase-frequency comparator 107 are operated such that as exemplified in FIG. 3 as a circuit diagram thereof, the output of the latch 301 is made to rise as the up signal by making the reference clock rise, the output of the latch 302 is made to rise as the down signal by rise of the feedback signal, and the latch 301 and the latch 302 are reset to fall by rise of both of the up signal and the down signal. Therefore, by constituting the reference clock to be a fixed potential, and inputting the feedback clock, the down signal can be fixed to a rise state and the up signal can be fixed to a fall state. When the fixed potential of the reference clock is switched to the clock from the state, the phase frequency comparator is reset by a timing of rise of the reference clock. When the frequencies of the reference clock and the feedback clock 5, substantially coincide with each other, a determination of a comparison of the phase is carried out by constituting the reference by the rise of the feedback clock after resetting.

Before outputting the enable signal 125 of FIG. 10, as the input of the second phase-frequency comparator 107, the control circuit portion 109 constitutes the second feedback clock 117 as the feedback clock 103 by the AND circuit 121, grounds the second reference clock 116 as the output of the latch 124 by the AND circuit 120, and fixes values of the latch 301 and the latch 302 in the second phase-frequency comparator in a state of rise of the second down signal 115, and fall of the second up signal 114, in this case. That is, the control circuit portion 109 brings the second phase-frequency comparator 107 into a state of generating a pulse of the second down signal 115 by controlling the latch of the second phase-frequency comparator 107. The first down signal 111 of the first phase-frequency comparator is selected as the down signal of the phase-frequency comparator 101 by the selector 122, and frequency lock and phase lock are carried out by an operation of the ordinary frequency synthesizer using the first phase-frequency comparing circuit. The above-described is a state of connecting the circuit before outputting the enable signal 125. At this occasion, the counter 123 counts a number of pulses of the reference clock 102, and outputs the signal to the latch 124 when a predetermined count number is reached. The predetermined count number is set such that a time period sufficient for locking the frequency synthesizer in a state of connecting the circuit before outputting the enable signal 125 is taken until the predetermined count number is reached. That is, the count number in this case is taken to be larger than a time period until locking the frequency and the phase in a state of connecting the circuit before outputting the enable signal 125 of the designed frequency synthesizer 101.

The latch 124 receiving the signal from the counter 123 outputs the enable signal 125. When the enable signal 125 is received by the AND circuit 120, the clock from the delay circuit portion 108 is inputted to the second reference clock 116 of the second phase-frequency comparator 107 which has been grounded. When the enable signal 125 is received by the flip-flop 128, the selecting signal 129 is outputted from the flip-flop 128, and the selecting signal 129 is received by the selector 122, as the down signal 105 of the phase-frequency comparator 101, the second down signal 115 of the second phase-frequency comparing circuit 107 is selected. At this occasion, the second down signal 115 is fixed to the rise state, the second up signal 114 is fixed to the down state, that is, there is brought about a state of generating the pulse of the second down signal 115, and therefore, as describe above, the initial rise of the second reference clock 116 after inputting the clock from the delay circuit portion 108 resets a total of the second phase-frequency comparator 107. Therefore, thereafter, the determination of the comparison with the phase is carried out at the second phase-frequency comparator 107 by a reference of the rise of the second feedback clock 117. Although at this occasion, the phase lock of the phase-frequency comparator 101 is instantaneously disengaged, the phase pull-in is carried out again to reach the lock.

As described above, the phase-frequency comparator 101 carries out the frequency comparing operation of the phase-frequency comparator 101 by outputting the first up signal 110 as the up signal 104 to the frequency synthesizer 201, and outputting the first down signal 111 as the down signal 105 to the frequency comparator 201. Further, the phase-frequency comparator 101 carries out the phase comparing operation of the phase-frequency comparator 101 by outputting the first up signal 110 as the up signal to the frequency synthesizer 201, starting the input from the delay circuit portion 108 to the second phase comparing circuit from the state of generating the pulse of the second down signal 115, and outputting the second down signal 115 as the down signal 105 to the frequency synthesizer 201.

Figure 11:
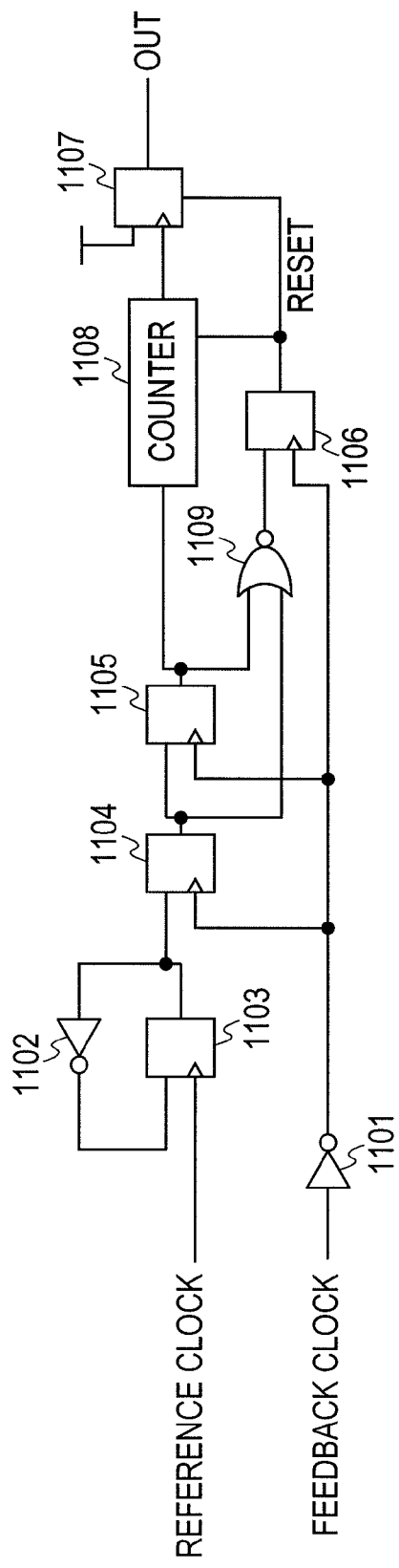
FIG. 11 is a diagram showing an example of other circuit of generating a sequence of switching an enable signal.

Further, the embodiment shown in FIG. 1 is a method of constituting a switching sequence by a simple circuit using the counter 123, and the switching may be carried out by using, for example, an output of a frequency lock detector exemplified in FIG. 11 in place of the counter 123. Further, the AND circuit 120 and the AND circuit 121 are used as the method of setting/resetting the second phase-frequency comparator for simplifying the circuit. Therefore, naturally, even a more complicated circuit can be operated similarly by the enable signal 125.

Figure 12:
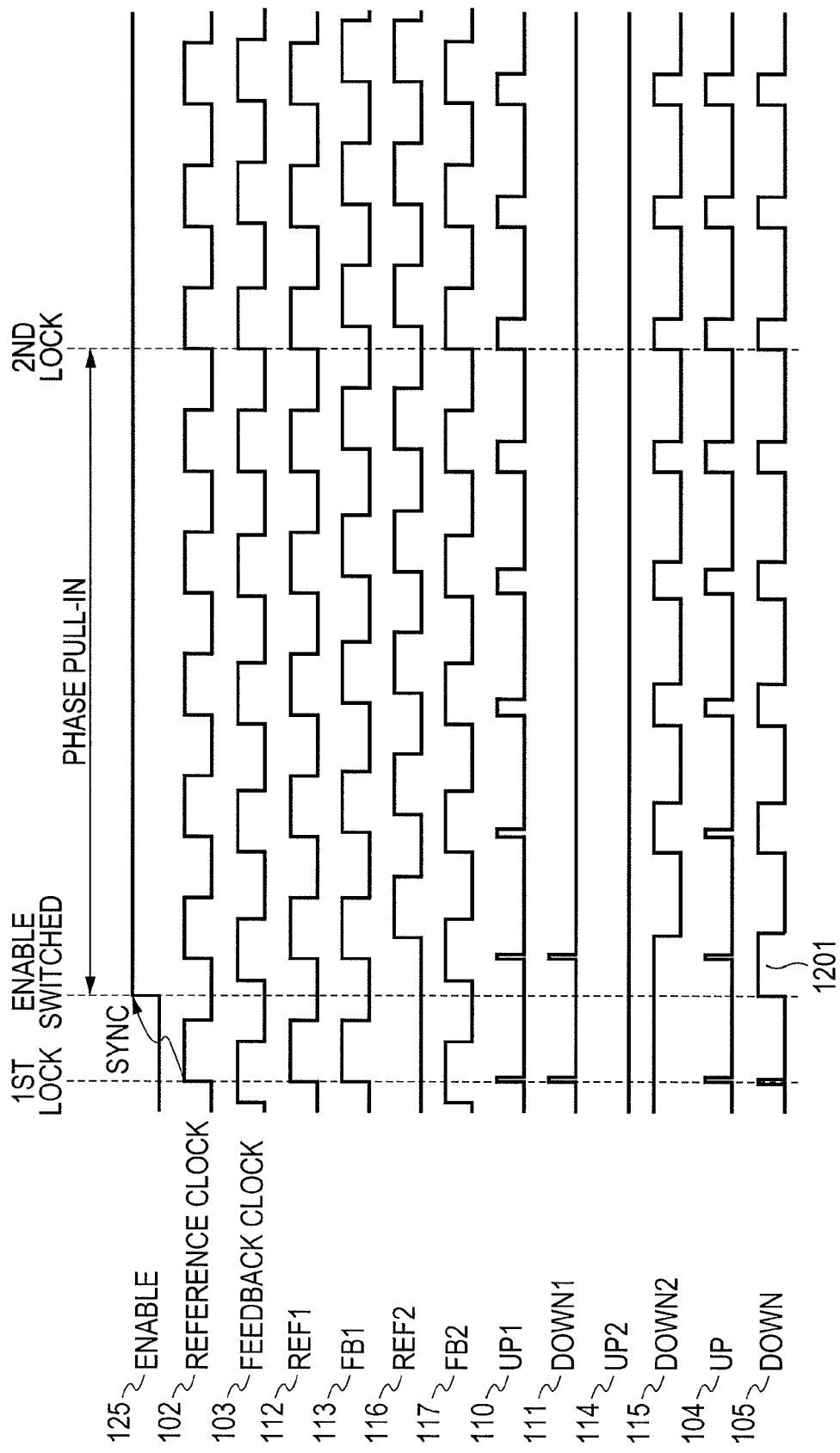
FIG. 12 is a timing chart showing a phase relocking operation according to the present invention.

FIG. 12 shows a timing chart of a repull-in procedure of the phase. Initially before outputting the enable signal 125, the reference clock is supplied only to the phase-frequency comparator 106, and therefore, after ordinary frequency and phase lock, the pulse is outputted to the first up signal 110 and the first down signal 111 and the second down signal 115, and a steady state is established by a state of advancing the feedback clock 103 relative to the reference clock 102 by an amount of the delay element 119. Here, in the lock state before outputting the enable signal 125, a short pulse is outputted at either of the first up signal 110 and the first down signal 111, because the case is exemplified since the phase-frequency comparing circuit constituted to output the short pulse such that the dead zone in detecting the phase reference is not present is general. Even when the phase-frequency comparing circuit having the dead zone is used, no problem is posed by the operation of the phase-frequency comparator according to the present invention.

Figure 9:
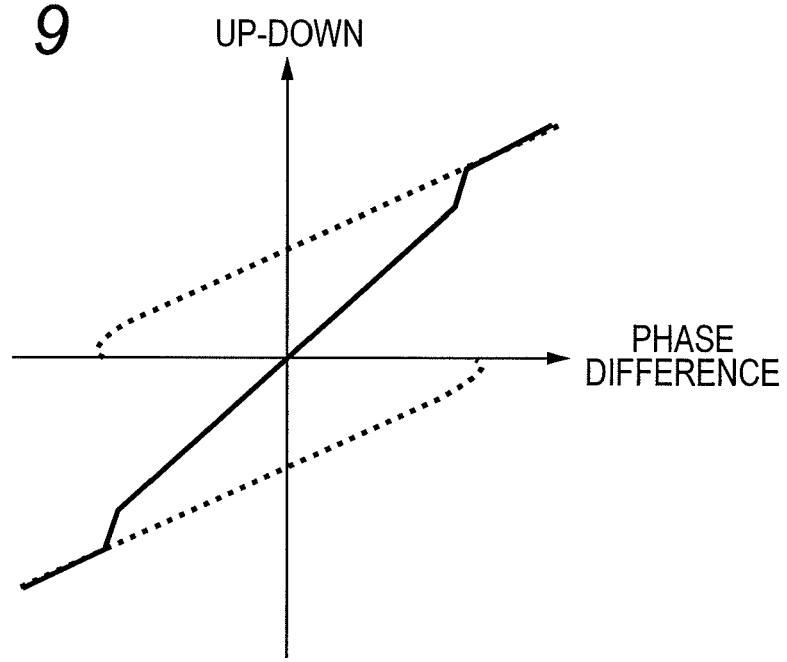
FIG. 9 is a diagram showing an output characteristic when a delay of the phase-frequency comparator improving the dead zone is increased.

After outputting the enable signal 125, as the down signal 105 of the phase-frequency comparator 101, the second down signal 115 of the second phase-frequency comparing circuit 107 is selected, and therefore, at the down signal 105, the pulse of the second down signal 115 generated by advancing the second feedback clock 117 by an amount of the delay element 119 and delaying the second reference clock 116 by an amount of the delay element 118 is outputted. As a result thereof, the phase of the feedback clock 103 is delayed, in accordance therewith, the pulse width of the first up signal 110 outputted from the first phase-frequency comparing circuit 106 is increased, output pulse widths of the first up signal 110 and the second down signal 115 become substantially the same, and the frequency synthesizer is locked. As described above, the predetermined phase difference is provided by the delay circuit portion 108, the frequency synthesizer is locked once by using the first up signal 110 and the first down signal 111 of the first phase-frequency comparing circuit 106, the latch of the second phase-frequency comparing circuit 107 is controlled by the control circuit portion 109, thereafter, the comparison with the phase is carried out, and therefore, the pair of phase edges constituting the object of the comparison coincide with each other between the first phase-frequency comparing circuit 106 and the second phase-frequency comparing circuit 107. Thereby, a desired output characteristic shown in FIG. 9, that is, the linearity in the wide phase difference range is achieved. Therefore, the phase-frequency comparator stabilizing the loop band width can be provided by a simple circuit.

Further, although in FIG. 12, a pulse 1201 is generated from the down signal 105 along with the enable signal 125, this shows a case where a time period until the selector 122 switches the output after the flip-flop 128 receives the enable signal 125 is short. When the time period is short in this way, the operation can be carried out by outputting the enable signal 125 from the latch 124 directly to the selector 122 in place of the selecting signal 129 without interposing the flip-flop 128. Here, for example, when the flip-flop 128 receives the reference clock 102 after receiving the enable signal 125, and outputs the selecting signal 129 after an elapse of an amount of 1 clock of the reference clock 102, the pulse 1201 is not outputted at the down signal 105. Thereby, the clock can be generated at a faster speed and stably by restraining an influence of a variation in the feedback clock 103 by unnecessarily increasing the pulse width of the pulse 1201.

Second Embodiment

A second embodiment shows a phase-frequency comparator in which ways of delaying the reference clock 102 and the feedback clock 103 are made to be reverse to those of the phase-frequency comparator 101 of the first embodiment, the down signal 105 to the frequency synthesizer is made to be the first down signal 111, and the up signal 104 to the frequency synthesizer is made to be the first up signal 110 or the second up signal 114 selected by the selector 122.

Figure 13:
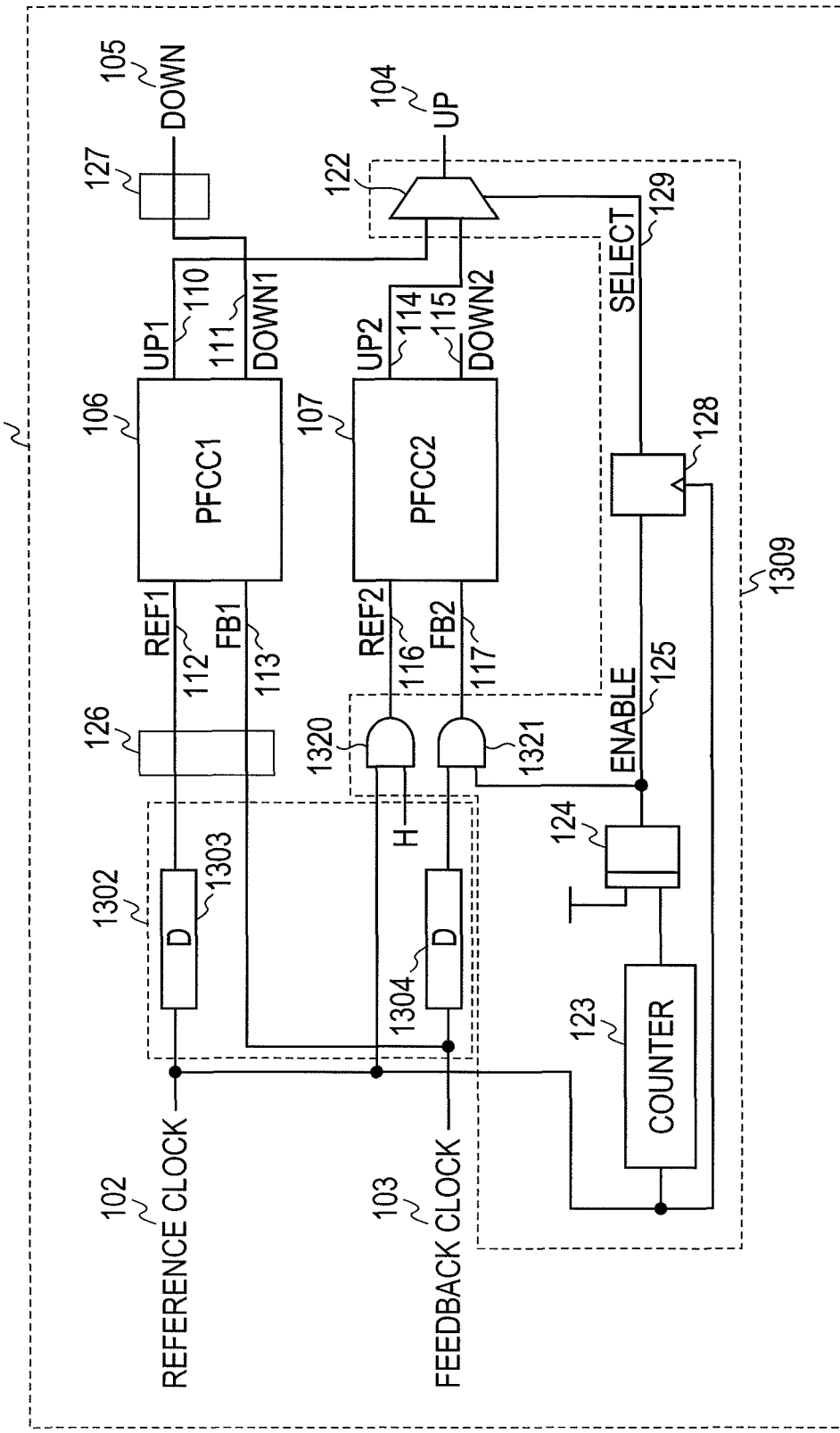
FIG. 13 is a block diagram showing an embodiment of a circuit constitution of a phase-frequency comparator according to the present invention.

FIG. 13 is a block diagram of a phase-frequency comparator 1301 of the embodiment. The phase-frequency comparator 1301 shown in FIG. 13 inputs the reference clock 102 and the feedback clock 103 and outputs the up signal 104 and the down signal 105 similar to the phase-frequency comparator 101. An explanation will be given as follows of an example of applying the phase-frequency comparator 1301 of FIG. 13 to the phase-frequency comparator 202 of the frequency synthesizer 201 of FIG. 2. That is, an explanation will be given as follows of an example of using the up signal 104 as the up signal to the frequency synthesizer 201 and the down signal 105 as the down signal to the frequency synthesizer 201 similar to the first embodiment. An explanation common to that of the phase-frequency comparator 101 of the first embodiment will be omitted.

The phase-frequency comparator 1301 is provided with the first phase-frequency comparing circuit 106, the second phase-frequency comparing circuit 107, a delay circuit portion 1302, and a control circuit portion 1309 similar to the phase-frequency comparator 101.

Although according to the embodiment, the output of the second down signal 115 is not needed, it is described that also the output of the second down signal 115 is provided, since promotion of the characteristic of the loop band width of the phase-frequency comparator 1301 can easily be achieved by making characteristics as uniform as possible between the first phase-frequency comparing circuit 106, and the second phase-frequency comparing circuit 107. Further, although the second phase-frequency comparing circuit may be the phase comparing circuit which does not carry out the comparison of the frequency, the phase-frequency comparing circuit is constituted, since promotion of the characteristic of the loop band width of the phase-frequency comparator 1301 can easily be achieved by making the characteristics as uniform as possible between the first phase-frequency comparing circuit 106, and the second phase-frequency comparing circuit 107.

The delay circuit portion 1302 inputs the reference clock 102 and the feedback clock 103, and outputs the reference clock 102 and the feedback clock 103 to the input of the first phase-frequency comparing circuit 106 and the input of the second phase-frequency comparing circuit 107 such that the delay amount of the feedback clock 103 relative to that of the reference clock 102 becomes relatively large in the input of the second phase-frequency comparing circuit 107 in comparison with in the input of the first phase-frequency comparing circuit 106. According to the embodiment, for that purpose, a delay element 1303 is provided between the input of the reference clock 102 of the phase-frequency comparator 1301 and the input of the reference clock 112 of the first phase-frequency comparing circuit 106, and a delay element 1304 is provided between the input of the feedback clock 103 of the phase-frequency comparator 1301 and the input of the feedback clock 117 of the second phase-frequency comparing circuit 107. That is, with regard to the first phase-frequency comparing circuit 106, the signal of delaying the reference clock 102 by the delay element 1303 is inputted, and with regard to the second phase-frequency comparator 107, the signal delaying the feedback clock 103 by the delay element 1304 is inputted.

According to the embodiment, the delay circuit 1303 and the delay circuit 1304 are respectively inserted to the input path of the first phase-frequency comparator 106 and the input path of the second phase-frequency comparator 107, thereby, a steady-state phase error can be restrained from being generated by making the circuits symmetrical to each other. However, in the case of posing the problem only by the linearity of the output relative to the phase reference, either one of the delay circuit 1303 and the delay circuit 1304 may be inserted thereinto.

The control circuit portion 1309 is provided with an AND circuit 1320, an AND circuit 1321, the selector 122, the counter 123, the latch 124, and the flip-flop 128 similar to the phase-frequency comparator 101. The AND circuit 1320 inputs the reference clock 102 and the power source level, and an output thereof is connected to the input of the second reference clock 116 of the delay circuit portion 1302. The AND circuit 1321 inputs an output from the delay element 1304 of the delay circuit portion 1302 and the output of the latch 124, and an output thereof is connected to the input of the second feedback clock 117 of the second phase frequency comparator 107. The selector 122 inputs the selecting signal 129 and the first up signal 110 and the second up signal 114, and outputs the up signal 104 of the phase-frequency comparator 1301.

Next, an explanation will be given of a difference of operation from that of the first embodiment of the phase-frequency comparator 1301. First, before outputting the enable signal 125, the second phase-frequency comparator 107 is fixed to a state of making the up signal rise, and making the down signal fall by constituting the feedback clock by a fixed potential in a state of inputting the reference clock contrary to the first embodiment. The control circuit portion 1309 switches the fixed potential of the feedback clock, to the clock from the state, and the latches 301 and 302 of the second phase-frequency comparing circuit 107 are reset at a timing of rise of the feedback clock. That is, the control circuit portion 1309 controls the latch of the second phase-frequency comparing circuit 107. Therefore, in a case where the frequencies of the reference clock 102 and the feedback clock 103 substantially coincide with each other, and the phase-frequency comparator 1301 is brought into the operation of the comparison of the phase, the determination of the comparison of the phase is carried out by constituting the reference by the rise of the second reference clock 116 in the second phase-frequency comparator 106.

The other operation is similar to that of the first embodiment, and the frequency comparing operation of the phase-frequency comparator 1301 is carried out by outputting the first down signal 111 as the down signal 105 to the frequency synthesizer 201, and outputting the first up signal 110 as the up signal to the frequency synthesizer 201. Further, the phase comparing operation after the frequency comparing operation is carried out by outputting the first down signal as the down signal 105 to the frequency synthesizer, starting the input from the delay circuit portion 1302 of the second phase comparing circuit from the state of generating the pulse of the second dup signal 114, and outputting the second up signal 114 as the up signal 104 to the frequency synthesizer.

The second up signal 114 of the second phase-frequency comparing circuit 107 is selected as the up signal 104 of the phase-frequency comparator 1301. Therefore, the up signal 104 is outputted with the pulse of the second up signal 114 generated by delaying the second feedback clock 117 by the amount of the delay element 1304, and advancing the second reference clock 116 by the amount of the delay element 1303. As a result thereof, the phase of the feedback clock 103 is advanced. In accordance therewith, the pulse width of the first down signal 111 outputted from the first phase-frequency comparing circuit 106 is increased, output pulse widths of the first down signal 111 and the second up signal 114 become substantially the same, and the frequency synthesizer is locked. At this occasion, the pair of phase edges constituting the object of the comparison coincide with each other between the first phase-frequency comparator 106 and the second phase-frequency comparator 107 from the reason similar to that of the first embodiment. Thereby, a desired output characteristic shown in FIG. 9, that is, the linearity in the wide phase difference range is achieved. Therefore, the phase-frequency comparator stabilizing the loop band width can be provided by a simple circuit.

Third Embodiment

Figure 14:
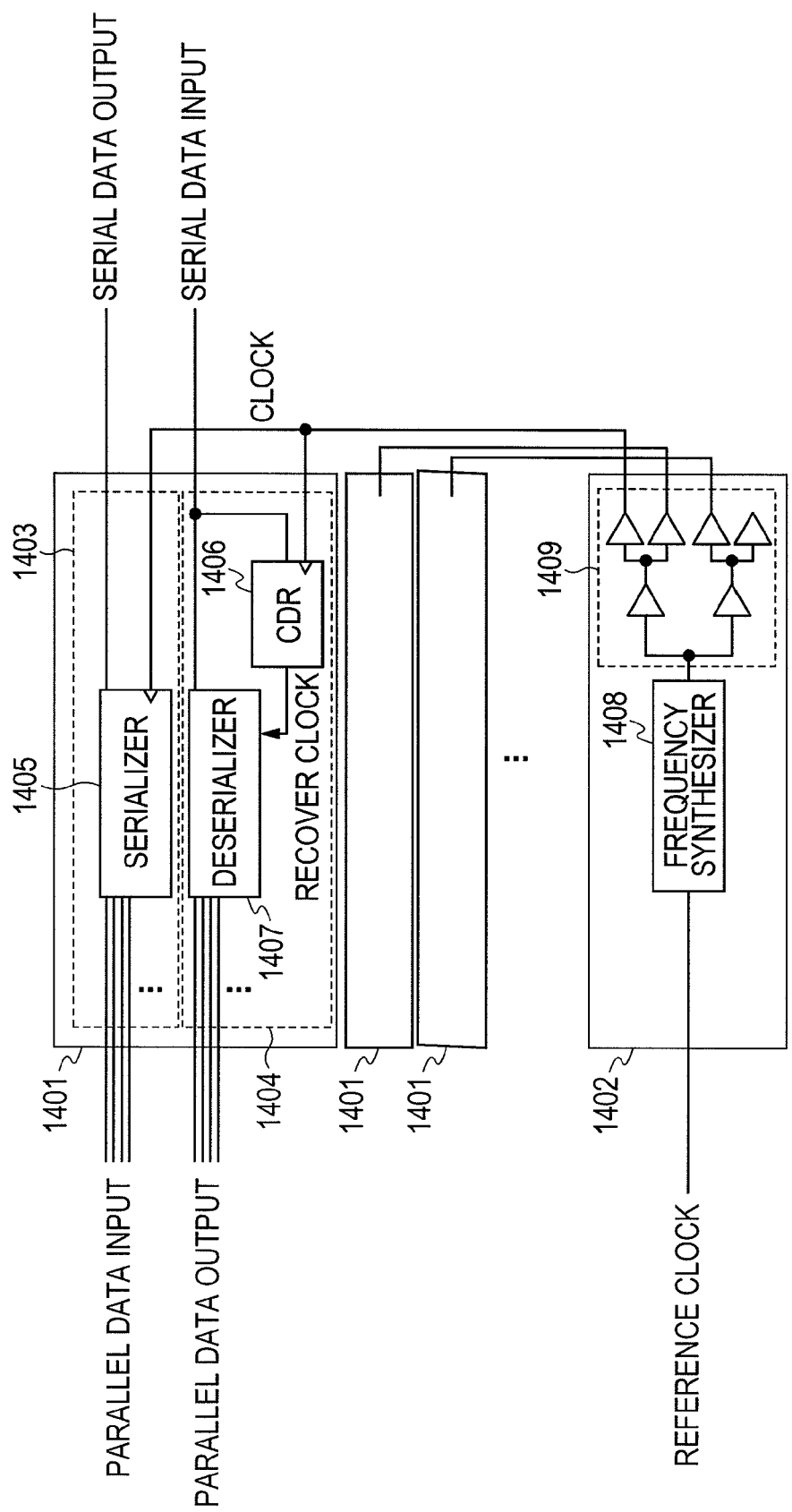
FIG. 14 is a block diagram showing an embodiment of a circuit constitution of a serial transmission device according to the present invention.

FIG. 14 shows a block diagram of an embodiment of a serial transmission device which is provided with a frequency synthesizer to which the phase-frequency comparator 101 or 1301 of the present invention is applied. The serial transmission device of the embodiment is provided with a channel portion 1401 constituting modules as transmitting/receiving channel, and a clock portion 1402 of distributing an operation clock to respective modules. Further, the channel portion is provided with a transmitting portion 1403, and a receiving portion 1404.

The transmitting portion 1403 is provided with a serializer 1405 which receives a parallel data inputted from outside and a clock inputted from the clock portion, converts the parallel data into a serial data, thereafter, outputs the serial data to outside.

The receiving portion 1404 is provided with CDR (Clock DATA Recovery) 1406 which receives the serial data inputted from outside and the clock inputted from the clock portion, and generates a clock optimized to a timing of inputting data, and a deserializer 1407 which receives the clock generated by CDR 1506 and the serial data inputted from outside, converts the serial data into the parallel data, thereafter, outputs the parallel data to outside.

The clock portion 1402 is provided with a frequency synthesizer 1408 which receives a reference clock inputted from outside, and outputting a clock multiplied by a frequency to the transmitting portion 1401 and the receiving portion 1402, and a buffer circuit 1409 of distributing the clock. As a phase-frequency comparator of the frequency synthesizer 1408, the phase-frequency comparator 101 of the first embodiment or the phase-frequency comparator 1301 of the second embodiment is used.

In serial transmission, a loop band width is standardized against a variation in a phase of a serial data outputted owing to a restriction of noise or jitter related to data transmission. The variation in the phase of serial data significantly depends on a characteristic of the frequency synthesizer of the clock portion, and therefore, by applying the present invention, the serial transmission device stabilizing the loop band width can be provided by a simple circuit.

What is claimed is:

1. A phase-frequency comparator which is a phase-frequency comparator constituting an input thereof by a reference clock and a feedback clock, and outputting an up signal to a frequency synthesizer and a down signal to the frequency synthesizer, the phase-frequency comparator comprising:
    a first phase-frequency comparing circuit for outputting a first up signal and a first down signal;
    a second phase comparing circuit for outputting a second down signal;
    a delay circuit portion constituting an input thereof by the reference clock and the feedback clock, and outputting the reference clock and the feedback clock to an input of the first phase-frequency comparing circuit and an input of the second phase comparing circuit such that an amount of delaying the reference clock relative to the feedback clock is relatively large in the input of the second phase comparing circuit in comparison with the input of the first phase-frequency comparing circuit; and
    a control circuit portion of controlling a latch of the second phase comparing circuit,
    wherein, in a first operation, a frequency comparing operation of the phase-frequency comparator is carried out by outputting the first up signal as the up signal to the frequency synthesizer and the first down signal as the down signal to the frequency synthesizer without outputting the second down signal to the frequency synthesizer, and
    wherein, in a second operation, a phase comparing operation of the phase-frequency comparator is carried out by outputting the first up signal as the up signal to the frequency synthesizer, starting the input of the second phase comparing circuit from a state of generating a pulse of the second down signal, and outputting the second down signal as the down signal to the frequency synthesizer without outputting the first down signal to the frequency synthesizer.

2. The phase-frequency comparator according to claim 1, wherein the delay circuit portion includes a first delay element between the input of the feedback clock and an output to the first phase-frequency comparing circuit.

3. The phase-frequency comparator according to claim 2, wherein the delay circuit portion includes a second delay element between the input of the reference clock and an output to the second phase comparing circuit.

4. The phase-frequency comparator according to claim 1, wherein the delay circuit portion includes a first delay element between the input of the reference clock and an output to the second phase comparing circuit.

5. The phase-frequency comparator according to claim 1, wherein the second phase comparing circuit is a phase-frequency comparing circuit.

6. A serial transmission apparatus comprising a frequency synthesizer including the phase-frequency comparator according to claim 1.

7. A phase-frequency comparator which is a phase-frequency comparator constituting an input thereof by a reference clock and a feedback clock, and outputting an up signal to a frequency synthesizer and a down signal to the frequency synthesizer, the phase-frequency comparator comprising:
   a first phase-frequency comparing circuit for outputting a first up signal and a first down signal;
   a second phase comparing circuit for outputting a second up signal;
   a delay circuit portion constituting an input thereof by the reference clock and the feedback clock, and outputting the reference clock and the feedback clock to an input of the first phase-frequency comparing circuit and an input of the second phase-frequency comparing circuit such that an amount of delaying the feedback clock relative to the reference clock is relatively large in the input of the second phase comparing circuit in comparison with the input of the first phase-frequency comparing circuit; and
   a control circuit portion of controlling a latch of the second phase comparing circuit,
   wherein, in a first operation, a frequency comparing operation of the phase-frequency comparator is carried out by outputting the first down signal as the down signal to the frequency synthesizer and the first up signal as the up signal to the frequency synthesizer without outputting the second up signal to the frequency synthesizer, and
   wherein, in a second operation, a phase comparing operation of the phase-frequency comparator is carried out by outputting the first down signal as the down signal to the frequency synthesizer, starting the input of the second phase comparing circuit from a state of generating a pulse of the second up signal, and outputting the second up signal as the up signal to the frequency synthesizer without outputting the first up signal to the frequency synthesizer.

8. The phase-frequency comparator according to claim 7, wherein the delay circuit portion includes a first delay element between the input of the reference clock and an output to the first phase-frequency comparing circuit.

9. The phase-frequency comparator according to claim 7, wherein the delay circuit portion includes a first delay element between the input of the feedback clock and an output to the second phase comparing circuit.

10. The phase-frequency comparator according to claim 8, wherein the delay circuit portion includes a second delay element between the input of the feedback clock and an output to the second phase comparing circuit.

11. The phase-frequency comparator according to claim 7, wherein the second phase comparing circuit is a phase-frequency comparing circuit.

12. A serial transmission apparatus comprising the frequency synthesizer including the phase-frequency comparator according to claim 7.

* * * * *